(12) United States Patent
Galler et al.

(10) Patent No.: US 11,276,800 B2
(45) Date of Patent: Mar. 15, 2022

(54) METHOD OF MANUFACTURING LIGHT EMITTING DIODES AND LIGHT EMITTING DIODE

(71) Applicant: OSRAM OLED GMBH, Regensburg (DE)

(72) Inventors: Bastian Galler, Regensburg (DE); Jürgen Off, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/493,499

(22) PCT Filed: Mar. 13, 2018

(86) PCT No.: PCT/EP2018/056158
§ 371 (c)(1),
(2) Date: Sep. 12, 2019

(87) PCT Pub. No.: WO2018/167011
PCT Pub. Date: Sep. 20, 2018

(65) Prior Publication Data
US 2020/0035858 A1     Jan. 30, 2020

(30) Foreign Application Priority Data

Mar. 14, 2017   (DE) .......................... 102017105397.2

(51) Int. Cl.
*H01L 33/10*    (2010.01)
*H01L 33/00*    (2010.01)
(Continued)

(52) U.S. Cl.
CPC .......... *H01L 33/10* (2013.01); *H01L 33/0075* (2013.01); *H01L 33/025* (2013.01);
(Continued)

(58) Field of Classification Search
CPC ..... H01L 33/10; H01L 33/12; H01L 33/0016; H01L 2933/0016; H01L 2933/0091; H01L 33/0075; H01L 33/22; H01L 33/025
See application file for complete search history.

(56) References Cited

U.S. PATENT DOCUMENTS 6,552,367 B1 *   4/2003   Hsieh ...................... H01L 33/02
                                                                    257/94
7,611,917 B2   11/2009   Emerson et al.
(Continued)

FOREIGN PATENT DOCUMENTS

| DE | 112006001084 T5 | 5/2008 |
| DE | 102012217640 A1 | 4/2014 |
| KR | 101165258 B1 | 7/2012 |

OTHER PUBLICATIONS

Jianjun, L. et al., "Electrical and Optical Properties of Deep Ultraviolet Transparent Conductive Ga2O3/ITO Films by Magnetron Sputtering," Journal of Semiconductors, vol. 31, No. 10, Oct. 2010, 5 pages.
(Continued)

*Primary Examiner* — Vincent Wall
(74) *Attorney, Agent, or Firm* — Slater Matsil, LLP

(57) ABSTRACT

A method for manufacturing light emitting diodes and a light emitting diode are disclosed. In an embodiment a method includes growing an n-conductive n-layer, growing an active zone for generating ultraviolet radiation, growing a p-conductive p-layer, producing a p-type semiconductor contact layer having a varying thickness and having a plurality of thickness maxima directly on the p-type layer and applying an ohmic-conductive electrode layer directly on the semiconductor contact layer, wherein each the n-layer and the active zone is based on AlGaN, the p-layer is based on AlGaN or InGaN and the semiconductor contact layer is a
(Continued)

GaN layer, wherein the thickness maxima have an area concentration of at least $10^4$ cm$^{-2}$ in a top view, and wherein the p-layer is only partially covered by the semiconductor contact layer in the top view.

18 Claims, 4 Drawing Sheets

(51) Int. Cl.
    *H01L 33/02*     (2010.01)
    *H01L 33/06*     (2010.01)
    *H01L 33/22*     (2010.01)
    *H01L 33/32*     (2010.01)
    *H01L 33/42*     (2010.01)
    *G01N 21/33*     (2006.01)

(52) U.S. Cl.
    CPC .............. *H01L 33/06* (2013.01); *H01L 33/22* (2013.01); *H01L 33/325* (2013.01); *H01L 33/42* (2013.01); *G01N 21/33* (2013.01); *H01L 2933/0016* (2013.01)

(56) References Cited

U.S. PATENT DOCUMENTS

| | | | | |
|---|---|---|---|---|
| 7,652,295 | B2* | 1/2010 | Cho | H01L 33/20 |
| | | | | 257/79 |
| 8,787,418 | B2* | 7/2014 | Shur | H01S 5/3216 |
| | | | | 372/45.012 |
| 9,728,674 | B2 | 8/2017 | Leirer et al. | |
| 2003/0160229 | A1* | 8/2003 | Narayan | H01S 5/34333 |
| | | | | 257/14 |
| 2004/0119082 | A1* | 6/2004 | Sugawara | H01L 33/32 |
| | | | | 257/94 |
| 2004/0159836 | A1* | 8/2004 | Sugimoto | H01L 33/38 |
| | | | | 257/40 |
| 2005/0199888 | A1* | 9/2005 | Seong | H01L 33/387 |
| | | | | 257/79 |
| 2009/0014713 | A1 | 1/2009 | Kang et al. | |
| 2010/0072487 | A1* | 3/2010 | Tsai | H01L 33/14 |
| | | | | 257/86 |
| 2011/0127539 | A1 | 6/2011 | Komada | |
| 2013/0221406 | A1* | 8/2013 | Gaska | H01L 29/452 |
| | | | | 257/191 |
| 2014/0016660 | A1 | 1/2014 | Lunev et al. | |
| 2014/0191398 | A1 | 7/2014 | Gaska et al. | |
| 2017/0005230 | A1 | 1/2017 | Desieres | |
| 2017/0018680 | A1* | 1/2017 | Shur | H01L 27/153 |

OTHER PUBLICATIONS

Kitamura, S., "Fabrication of GaN Hexagonal Pyramids on Dot-Patterned GaN/Sapphire Substrates via Selective Metalorganic Vapor Phase Epitaxy," Japanese Journal of Applied Physics, Journal of Applied Physics, 34, Part 2, No. 9B, Sep. 15, 1995, 4 pages.

Tsai, C.M. et al., "Enhanced Output Power in GaN-Based LEDs with Naturally Textured Surface Grown by MOCVD," IEEE Electron Device Letters, vol. 26, No. 7, Jul. 2005, 4 pages.

Zhang, J. et al., "The Advantages of AlGaN-Based UV-LEDs Inserted with a p-AlGaN Layer Between the EBL and Active Region," IEEE Photonics Journal, vol. 5, No. 5, Oct. 2013, 11 pages.

* cited by examiner

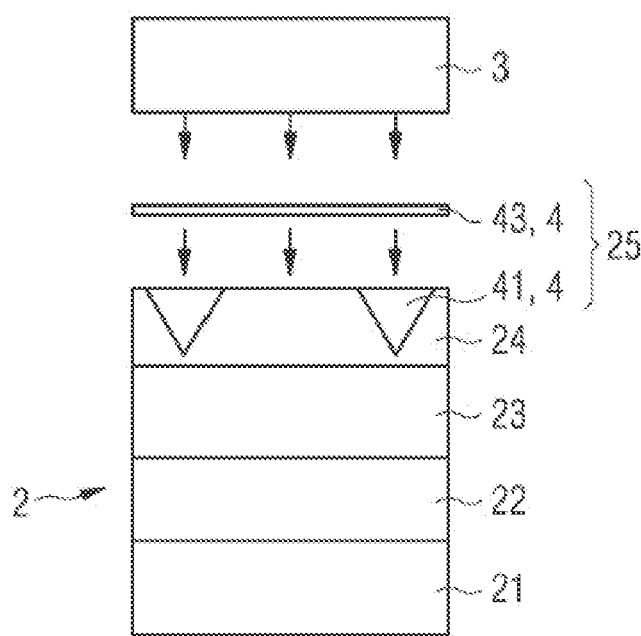
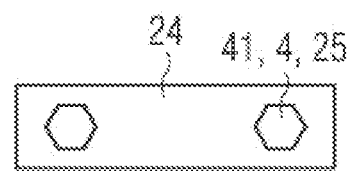
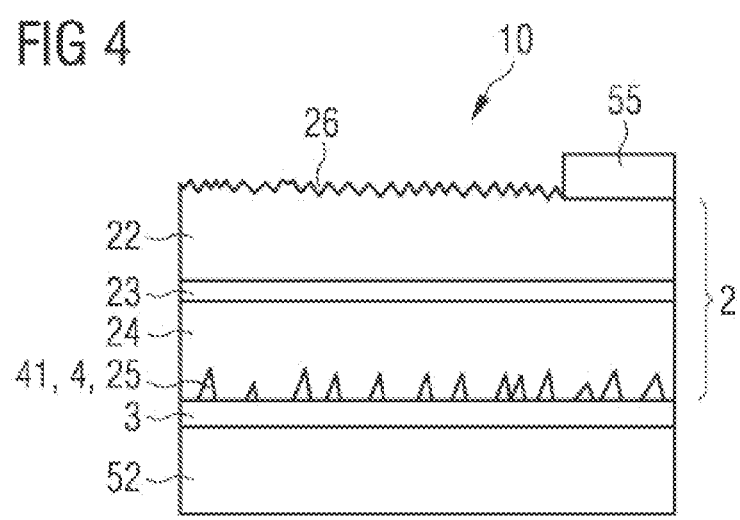

METHOD OF MANUFACTURING LIGHT EMITTING DIODES AND LIGHT EMITTING DIODE

This patent application is a national phase filing under section 371 of PCT/EP2018/056158, filed Mar. 13, 2018, which claims the priority of German patent application 102017105397.2, filed Mar. 14, 2017, each of which is incorporated herein by reference in its entirety.

TECHNICAL FIELD

A method for the manufacture of light emitting diodes is specified. In addition, a light emitting diode is specified.

SUMMARY OF THE INVENTION

Embodiments provide a light emitting diode which has a high light coupling-out efficiency in the ultraviolet spectral range.

According to at least one embodiment, light emitting diodes are produced by the method. The finished light emitting diodes emit incoherent radiation during operation, i.e., no laser radiation. In particular, they are light emitting diodes used to generate ultraviolet radiation, for example, with a wavelength of maximum intensity in the spectral range between 200 nm and 400 nm or including 200 nm and 300 nm.

According to at least one embodiment, the method comprises the step of growing an n-conductive n-layer. The n-layer may be formed by a single layer or composed of several sublayers, each of which is n-doped, for example, with silicon. Optionally, the n-layer contains a thin sublayer which is not necessarily n-doped and which may serve as a barrier layer for positive charge carriers, for example, with a thickness of at most 15 nm or 10 nm.

According to at least one embodiment, an active zone is grown. The active zone is configured to generate ultraviolet radiation. The preferred wavelength of maximum intensity of the radiation generated by the active zone in the finished light emitting diode is at least 205 nm or 217 nm and/or 360 nm or 310 nm or 270 nm or 230 nm. The preferred wavelength of maximum intensity is between 205 nm and 260 nm. The active zone preferably contains a multiple quantum well structure, also known as MQW.

According to at least one embodiment, a p-conductive p-layer is grown. The p-layer may contain several sublayers, each of which is preferably p-doped, for example, with magnesium. Optionally, the p-layer contains a sublayer that is not necessarily doped as a barrier layer for negative charge carriers, i.e., for electrons, with a thickness of at most 15 nm or 10 nm. Preferably the active zone on opposite sides directly adjoins the n-layer and the p-layer.

According to at least one embodiment, the method comprises the step of producing a p-type semiconductor contact layer. The semiconductor contact layer is part of the semiconductor layer sequence. The semiconductor contact layer is preferably heavily p-doped. Furthermore, the semiconductor contact layer is in direct contact with the p-layer at least in places. This means that the semiconductor contact layer and the p-layer touch each other. Current injection into the p-layer is preferably carried out exclusively or predominantly, at least 90% or 95%, via the semiconductor contact layer.

According to at least one embodiment, an electrode layer is applied to the semiconductor contact layer, in particular directly to the semiconductor contact layer. The electrode layer can also be composed of several sublayers. The electrode layer preferably contains one or more metal layers. The electrode layer is ohmic-conductive.

According to at least one embodiment, the electrode layer is applied directly to or on the semiconductor contact layer, so that the electrode layer and the semiconductor contact layer touch each other. It is possible that the electrode layer touches the p-layer, where a geometric contact area between the electrode layer and the p-layer can be larger than between the electrode layer and the semiconductor contact layer. For example, there is no or no significant current flow from the electrode layer directly into the p-layer, so that current is fed from the electrode layer into the semiconductor contact layer and from there into the p-layer. The electrode layer is especially configured as an anode. The contact layer is particularly necessary because the electrical barrier between the electrode and the p-layer is comparatively high for physical reasons. During operation, a current flow directly into the p-layer is therefore desired, but less or prevented than via the contact layer.

According to at least one embodiment, the n-layer and the active zone are each based on AlGaN. The n-layer and the active zone are preferably free of indium and each has, at least in places, a high aluminum content.

According to at least one embodiment, the p-layer is made of AlGaN or of InGaN or of AlInGaN.

According to at least one embodiment, the semiconductor contact layer is a GaN layer. This means that the semiconductor contact layer is preferably free of indium and aluminum.

In terms of the material compositions of the respective layers, only the essential components of the crystal lattice, i.e., aluminum, gallium, indium and nitrogen, are mentioned above. The respective layers may contain additional components in small quantities, such as oxygen, carbon, silicon and/or magnesium. Such impurities and/or doping shall preferably not exceed 0.1% by weight and/or at most $10^{23}/cm^3$ or $10^{21}/cm^3$.

According to at least one embodiment, the semiconductor contact layer has a varying thickness. The semiconductor contact layer has a large number of thickness maxima. The thickness maxima are separated from each other by areas with a smaller thickness of the semiconductor contact layer. Lower thickness in this context includes the case that the semiconductor contact layer may have a thickness of zero in places. This means that the thickness maxima can be formed by island-shaped, non-contiguous regions of the semiconductor contact layer.

According to at least one embodiment, the thickness maxima have an area concentration of at least $10^4/cm^2$ or $10^5/cm^2$ or $10^6/cm^2$. Alternatively or additionally, this area concentration is at most $10^9/cm^2$ or $10^8/cm^2$ or $10^7/cm^2$. In other words, many of the thickness maxima are present in the finished light emitting diodes. For example, the finished light emitting diodes have an average edge length of at least 0.25 mm or 0.5 mm and/or not more than 1.5 mm or 1 mm.

According to at least one embodiment, the thickness maxima are distributed irregularly. This means that, seen from above, the thickness maxima do not represent a regular grid. In particular, the thickness maxima are evenly distributed over the p-layer within the borders of statistical fluctuations, so that no areas with intentionally high or intentionally low surface concentrations are formed.

In at least one embodiment, the method is configured for the manufacture of light emitting diodes and comprises the following steps, preferably in the order indicated:

A) Growing an n-conducting n-layer,

B) Growing an active zone to generate ultraviolet radiation,

C) Growing of a p-conductive p-layer,

D) Forming a p-type semiconductor contact layer having a varying thickness and having a plurality of thickness maxima directly on, at or in the p-layer; and E) Applying an ohmic-conducting electrode layer directly on the semiconductor contact layer, wherein the n-layer and the active zone are each based on AlGaN and the p-layer is based on AlGaN or InGaN and the semiconductor contact layer is a GaN layer and the thickness maxima have an area concentration of at least $10^4$ cm$^{-2}$ or $10^6$ cm$^{-2}$ seen in top view.

Due to the material properties of AlGaN with a high aluminum content, in particular due to the very high activation energy of the usual acceptor magnesium, even compared to GaN, the production of p-doped AlGaN layers with a high aluminum content of sufficient conductivity and sufficiently low contact resistance for light emitting diodes, or LEDs for short, in particular for the generation of ultraviolet radiation, is only possible to a very limited extent. For this reason, UV LEDs usually use thin, continuous p-GaN layers on a p-side. Since the emission wavelength of these light emitting diodes is below the absorption edge of p-GaN of about 360 nm, such a continuous p-GaN layer absorbs a significant portion of the generated radiation and does not emit it.

With the light emitting diodes described here, three-dimensional structures, i.e., small islands containing p-GaN, are formed as an electrical connection layer during growth on the p side, which otherwise consists mainly of AlGaN. A metallic contact, for example, is then applied as an electrode layer that electrically connects the p-GaN islands and injects current there. Instead of metallic contacts, contacts made of transparent conductive oxides, TCOs for short, may also be used to form the electrode layer.

Due to the significantly reduced volume of the strongly absorbing p-GaN for the semiconductor contact layer the extraction probability for ultraviolet radiation is significantly increased. Such an increase can, with a high reflectivity of the electrode layer, be more than a factor of 2. Thus the external quantum efficiency can be significantly increased. The electrical efficiency of light emitting diodes, on the other hand, is usually reduced by the reduced p contact area caused by the structuring of the semiconductor contact layer. In view of the significantly increased extraction probability, however, the effect is compensated by the reduced p contact area, so that the light emitting diode is more efficient overall.

According to at least one embodiment, the p-layer is only partially covered by the semiconductor contact layer when viewed from above. The degree of coverage of the p-layer by the semiconductor contact layer is preferably at least 0.1% or 0.5% or 2% and/or at most 20% or 15% or 10% or 5%. Thus the external quantum efficiency can be increased with high reflectivity of the electrode layer.

According to at least one embodiment, a side of the electrode layer facing the semiconductor contact layer and/or a side of the active zone facing away from the p-layer are planar. In particular, this means that the aforementioned sides are free from intentionally produced structuring. Any unevenness is thus due to undesirable defects. Planar means, for example, a mean roughness of 2 nm or 0.5 nm or 0.25 nm.

According to at least one embodiment, the semiconductor contact layer is formed by a plurality of contact islands. Thus it is possible that the semiconductor contact layer is not a continuous layer. In particular, there is no connection between the contact islands made of a material of the semiconductor contact layer itself.

According to at least one embodiment, adjacent thickness maxima have a mean distance from each other of at least 0.1 µm or 0.4 µm or 1 µm or 3 µm when viewed from above. Alternatively or additionally, the mean distance shall not exceed 100 µm or 30 µm or 10 µm. If the semiconductor contact layer shows areas which have a maximum thickness over a larger area and thus an areal thickness maximum, then a point lying in the middle of this area, seen from above, is preferably regarded as thickness maximum. In this case, this means that per island-shaped area of the semiconductor contact layer there is exactly one point-shaped thickness maximum in top view.

The thickness maxima preferably correspond to one of the contact islands, so that there can be an unambiguous assignment between the contact islands and the thickness maxima and/or the contact islands are identical with the thickness maxima. The above values for the thickness maxima therefore apply in the same way to the contact islands.

According to at least one embodiment, there is a continuous sublayer on one side of the semiconductor contact layer facing the electrode layer. The sublayer is a part of the semiconductor contact layer and is preferably made of the same material as the thickness maxima. The electrode layer is preferably in direct contact with this sublayer over the entire surface. The sublayer may connect all thickness maxima with each other.

According to at least one embodiment, the sublayer of the semiconductor contact layer is thin. In particular, a thickness of the sublayer shall be at least 2 nm or 5 nm or 10 nm and/or at most 50 nm or 30 nm or 20 nm.

According to at least one embodiment, the thickness of the sublayer is smaller than an average height of the thickness maxima. In particular, the sublayer is at least 1.5 or 3 or 5 times thinner than the average thickness of the thickness maxima.

According to at least one embodiment, the thickness maxima are formed by V-defects filled with a material of the semiconductor contact layer. The V-defects are caused by the targeted opening of defects such as dislocations in the semiconductor layer sequence. The opening of the defects, so that the V-defects are pronounced, takes place, for example, in the p-layer, close to an interface to the active zone. Alternatively, the defects can already be opened in the active zone or in the n-layer to the V-defects. The resulting V-defects are preferably completely filled by the material of the semiconductor contact layer. Preferably, the opened V-defects are limited to the p-layer. This means that the previously linear, tubular defects such as dislocations are specifically opened and widened funnel-shaped or in the form of inverted pyramids.

According to at least one embodiment, the V-defects have an opening angle of at least 20° or 30° or 40° after opening. Alternatively or additionally, this opening angle shall not exceed 110° or 90° or 75°. In particular, the opening angle is approximately 60°.

According to at least one embodiment, the semiconductor layer sequence, in particular the p-layer, comprises an opening layer. In or at the opening layer, the previously existing defects, in particular the dislocations, are opened to the V-defects.

According to at least one embodiment, the opening layer is made of AlInGaN or InGaN. In particular, the opening layer contains indium. An indium content of the opening layer is preferably not more than 20% or 10% or 5%. For example, the thickness of the opening layer shall be at least 5 nm or 10 nm or 15 nm and/or at most 50 nm or 35 nm or 20 nm. If an opening layer is present, all remaining areas of the p-layer are preferably made of AlGaN, so that the opening layer can be the only part of the p-layer containing indium.

According to at least one embodiment, the opening layer is located on one side of the p-layer facing the active zone. The opening layer can form a boundary between the active zone and the p-layer or be located within the p-layer. A distance between the active zone and the opening layer is preferably not more than 50 nm or 30 nm or 15 nm.

According to at least one embodiment, in a step C1) between steps C) and D), a masking layer is produced on a side of the p-layer facing away from the active zone. The masking layer is preferably located directly on the p-layer. The masking layer is preferably made of a dielectric material, especially a nitride such as silicon nitride. A thickness of the masking layer is small, for example, at most 3 nm or 2 nm or 1 nm. In particular, the masking layer shall have an average thickness of not more than 1.5 monolayers or 1 monolayer.

According to at least one embodiment, the finished masking layer only partially covers the p-layer. The masking layer preferably has a large number of openings. In particular, the openings are statistically distributed across the p-layer. The masking layer can be formed self-organized, e.g., determined by the duration of a supply of starting materials for the masking layer. This means that it is not necessary for the masking layer to be structured using lithography or a stamping method, for example.

According to at least one embodiment, the semiconductor contact layer is formed in the openings, starting from the p-layer. This means that the semiconductor contact layer is grown on the p-layer from the openings. The material of the semiconductor contact layer preferably does not grow on the mask layer itself.

According to at least one embodiment, exactly one contact island of the semiconductor contact layer is generated per opening of the mask layer. Neighboring contact islands are preferably not interconnected by a material of the semiconductor contact layer, i.e., in particular by p-doped GaN. The masking layer is preferably only partially covered by the material of the semiconductor contact layer. Due to the growth of the contact islands, the material of the semiconductor contact layer can extend onto the masking layer at one edge of the openings when viewed from above.

According to at least one embodiment, the thickness maxima, in particular the contact islands and/or the filled V-defects, show p-doped GaN. A dopant concentration is preferably at least $10^{19}$ cm$^{-3}$ or $10^{20}$ cm$^{-3}$ and/or at most $10^{23}$ cm$^{-3}$ or $10^{22}$ cm$^{-3}$. A dopant is preferably magnesium.

According to at least one embodiment, the contact islands and/or the V-defects are covered with an intermediate layer in a step D1) between steps D) and E). The intermediate layer may be made of a semiconductor material such as undoped or doped AlGaN. Alternatively, it is possible that the interlayer is made of a dielectric material with a low refractive index compared to the semiconductor layer sequence, for example, an oxide such as silicon dioxide or a nitride such as silicon nitride. An intermediate layer composed of sublayers, such as a semiconductor material and a dielectric material, is also possible. Via a dielectric layer of the intermediate layer, in particular directly at the masking layer and/or at the p-layer, a high reflectivity of ultraviolet radiation can be achieved via total reflection over a substantial range of angles of incidence.

According to at least one embodiment, the contact islands and/or the V-defects are planarized with the intermediate layer. A continuous, contiguous layer is preferably formed by the intermediate layer together with the contact islands and/or the V-defects.

According to at least one embodiment, the intermediate layer after step D1) completely or partially covers the contact islands.

According to at least embodiment, the method comprises a step D2) performed between steps D1) and E). In step D2), the intermediate layer is partially removed so that the contact islands and/or the V-defects filled with the material of the semiconductor contact layer are exposed. This enables efficient contacting of the semiconductor contact layer with the electrode layer.

According to at least one embodiment, the individual layers of the semiconductor layer sequence, in particular the n-layer, the active zone, the p-layer and/or the semiconductor contact layer, are produced by means of metal organic vapor phase epitaxy, MOVPE for short. A growth temperature for the p-layer is preferably between 700° C. and 1100° C. inclusive, especially between 700° C. and 800° C. inclusive. In other words, the p-layer may be grown at comparatively low temperatures, especially in the case of opening V-defects.

Alternatively or in addition, the growth temperature of the semiconductor contact layer is comparatively high and is at least 900° C. or 950° C. or 970° C. and/or at most 1150° C. or 1100° C. or 1050° C.

In addition, a light emitting diode is indicated. The light emitting diode is preferably manufactured using a method as indicated in conjunction with one or more of the above embodiments. Characteristics of the method are therefore also disclosed for the light emitting diode and vice versa.

In at least one embodiment, the light emitting diode is configured to generate ultraviolet radiation and comprises an n-conducting n-layer, a p-conducting p-layer and an active zone for generating ultraviolet radiation arranged between them. A p-type semiconductor contact layer has a varying thickness with a variety of thickness maxima with a high area concentration and is located directly on the p-layer. An ohmic-conductive electrode layer is applied directly to the semiconductor contact layer.

According to at least one embodiment, the semiconductor contact layer is formed by V-defects filled with highly doped GaN.

According to at least one embodiment, the semiconductor contact layer is formed by contact islands of highly doped GaN. The contact islands start from apertures in a masking layer on the p-layer and partially cover the masking layer.

BRIEF DESCRIPTION OF THE DRAWINGS

In the following, a method described here and a light emitting diode described here are explained in more detail with reference to the drawing on the basis of exemplary embodiments. Same reference signs indicate the same elements in the individual figures. However, there are no references to scale shown, rather individual elements may be exaggeratedly large for a better understanding.

In the Figures:

FIGS. 2A, 3A, 5A, 5B, 6A, 7A and 7C show schematic sectional views of exemplary embodiments of method steps of a method;

FIGS. 2B, 3B, 6B and 7B show schematic top views of exemplary embodiments of method steps of a method; and FIG. 4 shows a schematic cross-sectional view of an exemplary embodiment of a light emitting diode.

DETAILED DESCRIPTION OF ILLUSTRATIVE EMBODIMENTS

Figure 1A:
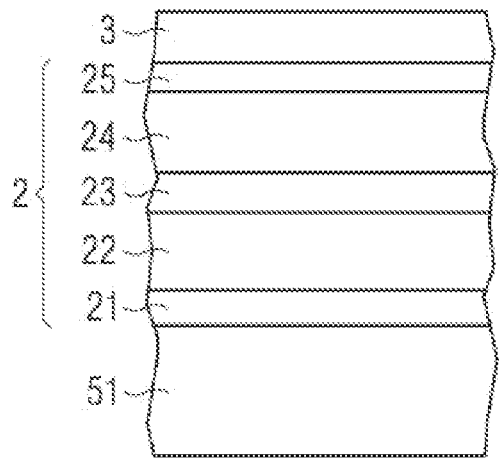
FIGS. 1A and 1B show schematic sections of variations of light emitting diodes.

In FIG. 1 a modification of a light emitting diode is shown. The light emitting diode is configured for emission of ultraviolet radiation R. On a growth substrate 51, the light emitting diode comprises a semiconductor layer sequence 2, see FIG. 1A. The semiconductor layer sequence 2 comprises a buffer layer 21, an n-conductive n-layer 22, an active zone 23, a p-conductive p-layer 24 and a continuous, areal p-conductive semiconductor contact layer 25. An ohmic-conductive electrode layer 3 is located on the semiconductor contact layer 25.

Figure 1B:
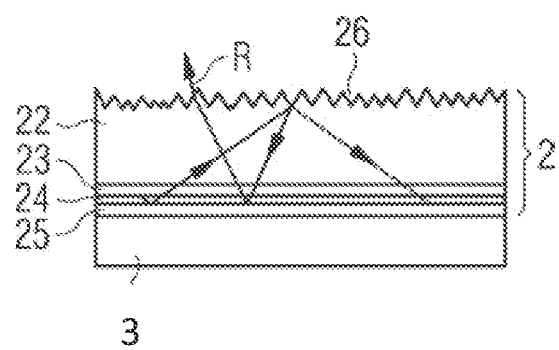

Radiation R generated in the active zone 23 is usually reflected several times in the semiconductor layer sequence 2 before the radiation R is coupled out from a roughening 26, see FIG. 1B. Since the semiconductor contact layer 25 absorbs the radiation R, comparatively large absorption losses occur at the areal semiconductor contact layer 25. This reduces efficiency. A wavelength of the radiation R is below 360 nm, corresponding to the absorption edge of GaN.

In FIGS. 2 and 3 the method steps for the production of light emitting diodes described here are illustrated, figure parts A showing a sectional view and figure parts B showing a schematic top view.

Figure 2A:
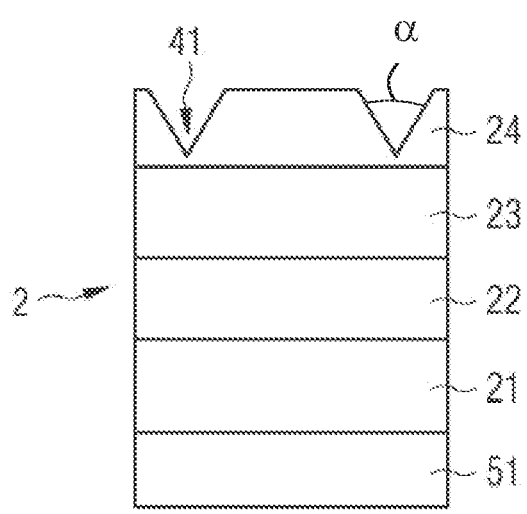
Figure 2B:

According to FIG. 2A, a growth substrate 51 is used, such as aluminum nitride. Buffer layer 21, for example, is made of aluminum nitride or AlGaN and is optionally n-doped. The n-layer 22 is an n-doped AlGaN layer. The active zone 23 is based on AlGaN and contains non-drawn quantum well layers as well as few drawn barrier layers. The active zone 23 is followed by the p-layer 24 over the entire surface, which is made of p-doped AlGaN, with an aluminum content, for example, of between 10% and 90% inclusive.

V-Defects 41 is opened at a border region of p-layer 24 to the active zone 23. Seen in cross-section the V-defects 41 are triangular, seen in top view they are hexagonal, see FIG. 2B. The V-defects 41 show in particular the shape of inverted, mostly regular hexagonal pyramids. In order to achieve opening of the V-defects 41 on previously existing, non-drawn dislocations, the p-layer 24 is particularly preferred grown at a combination of comparatively low temperatures, in particular T≤1000° C., comparatively high pressure, in particular p≥200 mbar, comparatively high hydrogen content in the gas phase and/or comparatively weakly doped with magnesium, for example, with a dopant concentration of ≤2×10$^{19}$ cm$^{-3}$. An opening angle of the V-defects 41, seen in cross-section, is approximately 60°.

FIG. 3 illustrates that the V-defects 41 are filled with a material for the semiconductor contact layer 25, wherein reference numeral 4 denotes a thickness maxima. The semiconductor contact layer 25 is of p-GaN with a dopant concentration of preferably at least 10$^{19}$ cm$^{-3}$ to 10$^{21}$ cm$^{-3}$, whereby magnesium is used as the dopant. The semiconductor contact layer 25 is preferably deposited at a combination of comparatively high temperatures, in particular T≥900° C., and comparatively highly doped with magnesium, for example, with a dopant concentration of ≥2*10$^{19}$ cm$^{-3}$.

The semiconductor contact layer 25 in the V-defects 41, for example, extends at least 50% or 75% and/or at most 90% or 95% through the p-layer 24. Deviating from the representation in FIGS. 2 and 3, the V-defects can also begin in the n-layer 22 or in the active zone 23 (not shown). A thickness of p-layer 24, for example, is, as is preferred in all other exemplary embodiments, at least 50 nm or 100 nm or 200 nm and/or at most 500 nm or 300 nm. Seen from above, the semiconductor contact layer 25 only covers a small part of the surface of the p-layer 24.

Optionally, a sublayer 43 of the semiconductor contact layer 25 can be produced over the entire surface of the filled V-defects 41 and on the p-layer 24. This sublayer 43 forms an improved contact with the electrode layer 3, which is subsequently applied, e.g., of aluminum. The sublayer 43 has only a small thickness, for example, between 5 nm and 15 nm, so that the absorption of UV radiation in the sublayer 43 is weak.

The method steps of FIGS. 2 and 3 are preferably carried out in a wafer composite. Steps such as applying a carrier substrate, detaching the growth substrate 51 or singulation into individual light emitting diodes, and applying electrical contact structures are each not shown to simplify the representation.

In FIG. 4 an exemplary embodiment of the LED 10 is shown. The carrier substrate 52 is used for electrical contacting via electrode layer 3. Current flows dominantly from electrode layer 3 into semiconductor contact layer 25 and from this into p-layer 24 and over this into the active zone 23. Reference numeral 4 denotes a thickness maxima. The n-side 22, for example, can be electrically connected via an electrical contact surface 55, such as a bond pad. As in all other exemplary embodiments, the growth substrate 51 is optionally removed and a roughening 26 is provided to improve the light extraction.

Due to the triangular cross-sectional area of the filled V-defects 41, a large ratio of the outer surface of the semiconductor contact layer 25 to its volume is realized. Thus, on the one hand an efficient current injection into the p-side 24 can be achieved, and on the other hand, due to the small volume, only little absorption of UV radiation takes place in the semiconductor contact layer 25. By exploiting defects such as dislocations and the targeted opening of the V-defects, small structures and small mean distances between adjacent thickness maxima 4 can be achieved. Since the V-defects 41 are completely filled, a smooth surface can be achieved on one side of the p-layer 24 and the semiconductor contact layer 25 facing away from the active zone 23, whereby an increased reflectivity can be achieved on the electrode layer 3, which is preferably a mirror.

In FIG. 5, the semiconductor layer sequence 2 additionally has an opening layer 44. The opening layer 44 is, for example, made of AlInGaN, with a comparatively low indium content. This makes it possible to open the V-defects 41 in or at the opening layer 44 in a targeted manner.

Figure 5A:
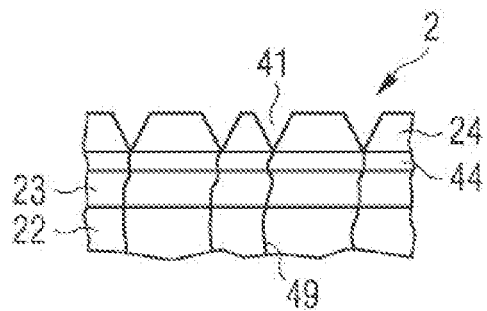
Figure 5B:
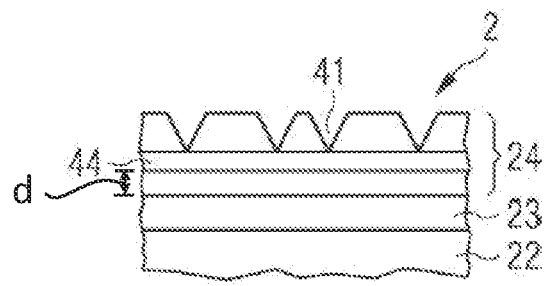

According to FIG. 5A, the opening layer 44 is located at the boundary between the active zone 23 and the p-layer 24, whereas according to FIG. 5B, the opening layer 44 is located within the p-layer 24, for example, with a distance to the active zone 23 of about 10 nm.

Figure 6A:
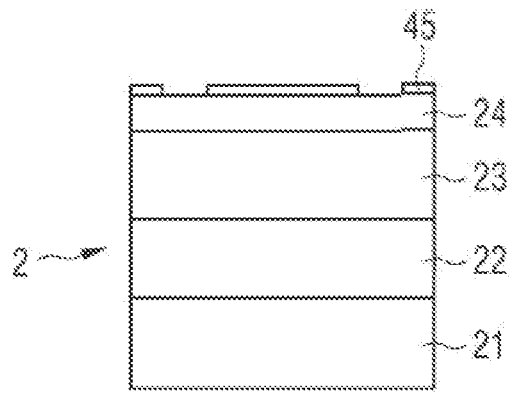
Figure 6B:
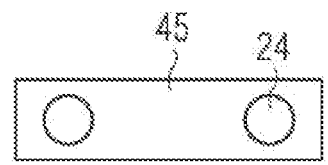

In FIGS. 6 and 7 a further example of a manufacturing method for the production of light emitting diodes is shown. Deviating from FIG. 2, no V-defects are generated in the p-layer. The prevention of the opening of V-defects is achieved in particular by growing the p-layer 24 at comparatively high temperatures, especially at 1200° C.+/−50° C., in contrast to FIG. 2. A masking layer 45 is applied locally to the p-layer 24, for example, of silicon nitride and with an average thickness of only less than one monolayer up to several monolayers. The masking layer 45 contains a large number of openings which can be self-organized and in which the p-layer 24 remains free, see FIG. 6B.

Figure 7A:
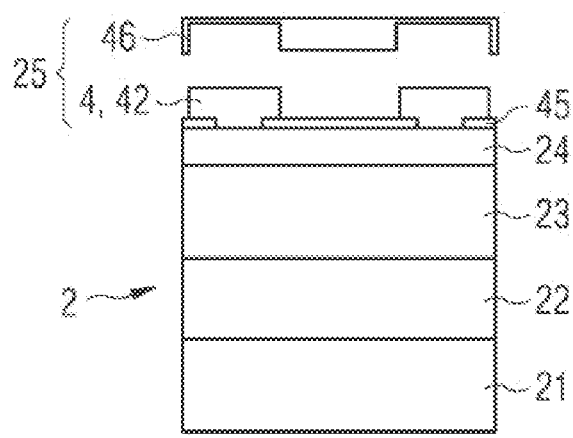
Figure 7B:
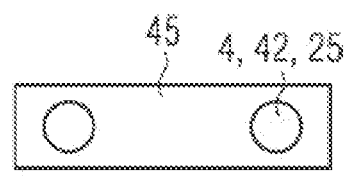

According to FIG. 7A, the material for the semiconductor contact layer 25 is deposited starting from the openings in the masking layer 45, so that thickness maxima 4 are formed in the form of individual, non-contiguous contact islands 42, see the top view in FIG. 7B.

Optionally, an intermediate layer 46 can be produced before the electrode layer 3 is applied, which can be done by sputtering or vapor deposition, for example. The intermediate layer 46 serves to planarize the thickness maxima 4. For example, the intermediate layer 46 is made of AlGaN, as is the p-layer 24. In this case, the intermediate layer 46 can be doped or undoped. Alternatively, a dielectric material such as silicon dioxide is deposited in order to achieve increased reflectivity in the interaction of the electrode layer 3.

Figure 7C:
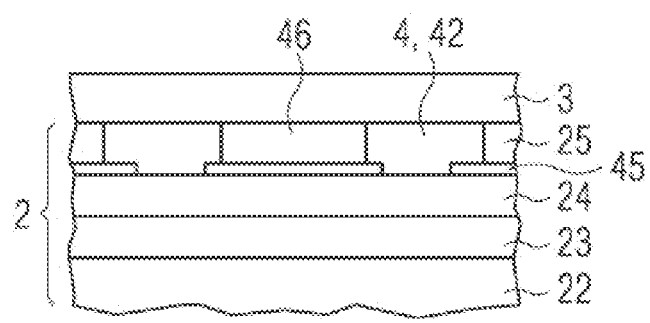

According to FIG. 7A, the intermediate layer 46 is optionally deposited in such a way that the contact islands 42 are at least partially covered by the material of the intermediate layer 46. FIG. 7C illustrates that after generating the intermediate layer 46, it is partially removed again, so that the intermediate layer 46 together with the contact islands 42 form a smooth side facing away from the active zone 23 on which the electrode layer 3 is directly applied. Thus the contact islands 42 are located directly on the electrode layer 3 on the side facing away from the active zone 23.

The masking layer 45 is completely covered by the intermediate layer 46 together with the contact islands 42. The contact islands 42 at one edge of the openings partially cover the masking layer 45.

The intermediate layer 46 can be removed mechanically and/or chemically. In contrast to the illustration in FIGS. 7A and 7C, the intermediate layer 46 may also be composed of several sublayers, in particular to achieve increased reflectivity at the intermediate layer 46 and at the electrode layer 3.

The proportion of the surface of the p-layer directly covered by the contact islands 42 can be adjusted by such a masking layer 45, e.g., by the growth time of the masking layer 45. Instead of a self-organized masking layer 45, structuring can alternatively be carried out using a stamping method or lithographic methods.

As an alternative to a metallic, reflecting electrode layer 3, an electrode layer transparent to the generated radiation R can be used in each case, in particular made of transparent conductive oxides, TCOs for short. For example, Ga2O3, ITO or a Sr—Cu oxide, individually or in combination, can be used.

Creating the intermediate layer 46 is optional. If the intermediate layer 46 is omitted, electrode layer 3 is applied directly to the masking layer 45 and the contact islands 42 and has a comparatively rough, structured side facing the active zone 23. This is particularly possible if the electrode layer 3 is formed from a TCO.

Light emitting diodes 10 described here are used, for example, for gas sensors to detect certain gas absorption lines. For example, a wavelength of maximum intensity of the generated radiation R lies between 217 nm and 230 nm. An emitted radiant power of the radiation R, for example, is approximately 1 mW.

Unless otherwise indicated, the components shown in the figures follow each other directly in the order indicated. Layers not touching each other in the figures are spaced from each other. As far as lines are drawn parallel to each other, corresponding surfaces are also parallel to each other. Also, unless otherwise indicated, the relative thickness ratios, length ratios and positions of the drawn components to each other are correctly reproduced in the figures.

The invention described here is not limited by the description given by way of the exemplary embodiments. Rather, the invention includes each new feature as well as each combination of features, which in particular includes each combination of features in the patent claims, even if that feature or combination itself is not explicitly stated in the patent claims or exemplary embodiments.

The invention claimed is:

1. A method of manufacturing light emitting diodes, the method comprising:
growing an n-conductive n-layer;
growing an active zone for generating ultraviolet radiation;
growing a p-conductive p-layer;
producing a p-type semiconductor contact layer having a varying thickness and having a plurality of thickness maxima directly on the p-layer; and
applying an ohmic-conductive electrode layer directly on the semiconductor contact layer,
wherein each of the n-layer and the active zone is based on AlGaN,
wherein the p-layer is based on AlGaN or InGaN,
wherein the semiconductor contact layer is a GaN layer,
wherein the p-layer comprises a plurality of V-defects,
wherein the semiconductor contact layer is formed in the V-defects,
wherein the semiconductor contact layer has the varying thickness and the plurality of thickness maxima in the V-defects,
wherein the thickness maxima have an area concentration of at least $10^4$ cm$^{-2}$ in a top view, and
wherein the p-layer is only partially covered by the semiconductor contact layer in the top view.

2. The method according to claim 1,
wherein a side of the electrode layer facing the semiconductor contact layer and a side of the active zone facing away from the p-layer are planar.

3. The method according to claim 2,
wherein a degree of coverage of the p-layer by the semiconductor contact layer is between 0.5% and 10% inclusive, and
wherein adjacent thickness maxima have an average distance from one another between 1 μm and 30 μm inclusive in the top view.

4. The method according to claim 1,
wherein the thickness maxima are formed by the V-defects filled with material of the semiconductor contact layer,
wherein previously existing defects are selectively opened to form the V-defects while growing the p-layer, and
wherein the V-defects have an opening angle between 30° and 90° inclusive after opening.

5. The method according to claim 1,
wherein the p-layer comprises an opening layer in or at which previously existing defects open to the V-defects, and wherein the opening layer comprises AlInGaN or InGaN and contains indium and all remaining regions of the p-layer are grown of AlGaN.

6. The method according to claim 5, wherein the opening layer is located on a side of the p-layer facing the active zone and a distance between the active zone and the opening layer is at most 30 nm.

7. The method according to claim 1,
wherein the p-layer and the semiconductor contact layer are produced by a metal organic vapor phase epitaxy,
wherein a growth temperature for the p-layer is between 700° C. and 800° C. inclusive, and
wherein the semiconductor contact layer is grown at a growth temperature between 950° C. and 1100° C. inclusive.

8. The method according to claim 1, wherein the electrode layer comprises a transparent conductive oxide directly on the semiconductor contact layer.

9. The method according to claim 1, wherein the active zone is configured to generate radiation having a wavelength of maximum intensity between 205 nm and 260 nm inclusive.

10. The method according to claim 1, wherein the semiconductor contact layer in the V-defects extend through the p-layer by at least 50% and at most 95%.

11. The method according to claim 1, wherein the semiconductor contact layer in the V-defects extend through the p-layer by at least 75% and at most 90%.

12. A method for manufacturing light emitting diodes, the method comprising:
growing an n-conductive n-layer;
growing an active zone for generating ultraviolet radiation;
growing a p-conductive p-layer;
producing a p-type semiconductor contact layer having a varying thickness and a plurality of thickness maxima directly on the p-layer; and
applying an ohmic-conductive electrode layer directly on the semiconductor contact layer,
wherein each of the n-layer and the active zone is based on AlGaN,
wherein the p-layer is based on AlGaN or InGaN,
wherein the semiconductor contact layer is a GaN layer,
wherein the semiconductor contact layer is formed by a plurality of contact islands and is not a continuous layer,
wherein the p-layer is only partially covered by the semiconductor contact layer in a top view,
wherein the contact islands are overgrown with an intermediate layer after producing the semiconductor contact layer and before applying the electrode layer so that a continuous contiguous layer is formed by the intermediate layer and the contact inlands, and so that the intermediate layer covers the contact islands, and
wherein the intermediate layer is partially removed so that the contact islands are exposed.

13. The method according claim 12, wherein the thickness maxima have an area concentration of at least $10^4$ $cm^{-2}$ in the top view.

14. The method according to claim 12, wherein a side of the electrode layer facing the semiconductor contact layer and a side of the active zone facing away from the p-layer are planar.

15. The method according to claim 12,
wherein a degree of coverage of the contact islands is between 0.5% and 10% inclusive, and
wherein adjacent thickness maxima, which are equal to the contact islands, have an average distance from one another between 1 μm and 30 μm inclusive in the top view.

16. The method according to claim 12, further comprising producing a masking layer before producing the semiconductor contact layer,
wherein the masking layer is produced on a side of the p-layer facing away from the active zone,
wherein the masking layer only partially covers the p-layer and has a plurality of apertures, and
wherein the semiconductor contact layer is grown in openings of the masking layer starting from the p-layer so that the contact islands are formed.

17. The method according to claim 16, wherein exactly one contact island is formed per opening of the masking layer and adjacent contact islands are not interconnected by a material of the semiconductor contact layer itself so that the masking layer is only partially covered by the material of the semiconductor contact layer.

18. The method according to claim 12, wherein the contact islands comprise GaN with an Mg dopant concentration between $10^{19}$ $cm^{-3}$ and $10^{23}$ $cm^{-3}$ inclusive, and wherein the intermediate layer comprises an undoped AlGaN.

* * * * *